US010522620B2

United States Patent
Nishiguchi (10) Patent No.: US 10,522,620 B2
(45) Date of Patent: Dec. 31, 2019

(54) SEMICONDUCTOR DEVICE HAVING A VARYING LENGTH CONDUCTIVE PORTION BETWEEN SEMICONDUCTOR REGIONS

(71) Applicants: Kabushiki Kaisha Toshiba, Minato-ku (JP); Toshiba Electronic Devices & Storage Corporation, Minato-ku (JP)

(72) Inventor: Toshifumi Nishiguchi, Hakusan (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/025,551

(22) Filed: Jul. 2, 2018

(65) Prior Publication Data

US 2019/0245036 A1 Aug. 8, 2019

(30) Foreign Application Priority Data

Feb. 2, 2018 (JP) ................................. 2018-017351
Apr. 27, 2018 (JP) ................................. 2018-086469

(51) Int. Cl.
*H01L 29/02* (2006.01)
*H01L 29/06* (2006.01)
(Continued)

(52) U.S. Cl.
CPC .... *H01L 29/0661* (2013.01); *H01L 21/02129* (2013.01); *H01L 21/2255* (2013.01);
(Continued)

(58) Field of Classification Search
CPC .......... H01L 29/0661; H01L 29/02129; H01L 29/2255; H01L 29/26513; H01L 29/3065;
(Continued)

(56) References Cited

U.S. PATENT DOCUMENTS 7,696,569 B2    4/2010 Fujimoto et al.
8,575,689 B2 *  11/2013 Mimura ............. H01L 29/4236
                                                       257/330
(Continued)

FOREIGN PATENT DOCUMENTS

JP    2871216      3/1999
JP    2010-251608  11/2010
JP    5533011      6/2014

OTHER PUBLICATIONS

Miyake, M. "Diffusion of Boron into Silicon from Borosilicate Glass Using Rapid Thermal Processing", J. Electrochem. Soc., 1991, vol. 138, No. 10, 3031-3039.

*Primary Examiner* — Alonzo Chambliss
(74) *Attorney, Agent, or Firm* — Oblon, McClelland, Maier & Neustadt, L.L.P.

(57) ABSTRACT

According to one embodiment, a semiconductor device includes a first semiconductor region of a first conductivity type, a second semiconductor region of a second conductivity type, a third semiconductor region of the first conductivity type, a gate electrode, and a conductive portion. The second semiconductor region is provided on the first semiconductor region. The third semiconductor region is provided on the second semiconductor region. The gate electrode opposes, in a second direction with a gate insulating layer interposed, the third semiconductor region, the second semiconductor region, and the first semiconductor region. The second direction is perpendicular to a first direction from the second semiconductor region toward the third semiconductor region. The conductive portion includes first and second portions. The first and second portions are respectively arranged with the second and third semiconductor regions. A length of the first portion is longer than a length of the second portion.

11 Claims, 9 Drawing Sheets

(51) Int. Cl.

| | | |
|---|---|---|
| *H01L 21/3205* | (2006.01) | |
| *H01L 29/10* | (2006.01) | |
| *H01L 29/417* | (2006.01) | |
| *H01L 29/78* | (2006.01) | |
| *H01L 29/739* | (2006.01) | |
| *H01L 21/768* | (2006.01) | |
| *H01L 21/3065* | (2006.01) | |
| *H01L 21/02* | (2006.01) | |
| *H01L 21/225* | (2006.01) | |
| *H01L 21/324* | (2006.01) | |
| *H01L 21/265* | (2006.01) | |

(52) U.S. Cl.
CPC .... *H01L 21/26513* (2013.01); *H01L 21/3065* (2013.01); *H01L 21/324* (2013.01); *H01L 21/7684* (2013.01); *H01L 21/76852* (2013.01); *H01L 21/76895* (2013.01); *H01L 29/0696* (2013.01); *H01L 29/1095* (2013.01); *H01L 29/41741* (2013.01); *H01L 29/7397* (2013.01); *H01L 29/7813* (2013.01)

(58) Field of Classification Search
CPC ............... H01L 29/324; H01L 29/7684; H01L 29/76852; H01L 29/76895; H01L 29/7397; H01L 29/7813; H01L 29/0696; H01L 29/1095; H01L 29/41741
See application file for complete search history.

(56) References Cited

U.S. PATENT DOCUMENTS

| | | | | |
|---|---|---|---|---|
| 8,659,065 | B2* | 2/2014 | Sumitomo | .......... H01L 29/0619 |
| | | | | 257/139 |
| 8,981,470 | B2* | 3/2015 | Nozu | .................. H01L 29/7813 |
| | | | | 257/331 |
| 9,536,999 | B2* | 1/2017 | Laven | ................. H01L 29/4236 |
| 9,608,074 | B2* | 3/2017 | Wada | ................. H01L 29/66068 |
| 9,647,106 | B2* | 5/2017 | Masuda | ............... H01L 29/7813 |
| 2006/0267085 | A1* | 11/2006 | Matsuura | ........... H01L 29/4236 |
| | | | | 257/330 |
| 2006/0273386 | A1 | 12/2006 | Yilmaz et al. | |
| 2013/0153995 | A1 | 6/2013 | Misawa et al. | |
| 2015/0115314 | A1* | 4/2015 | Arakawa | ............. H01L 29/4236 |
| | | | | 257/139 |
| 2016/0372586 | A1* | 12/2016 | Fujii | ................. H01L 29/42368 |
| 2017/0263752 | A1 | 9/2017 | Kobayashi | |

* cited by examiner

SEMICONDUCTOR DEVICE HAVING A VARYING LENGTH CONDUCTIVE PORTION BETWEEN SEMICONDUCTOR REGIONS

CROSS-REFERENCE TO RELATED APPLICATIONS

This application is based upon and claims the benefit of priority from Japanese Patent Application No. 2018-017351, filed on Feb. 2, 2018 and Japanese Patent Application No. 2018-086469, filed on Apr. 27, 2018; the entire contents of which are incorporated herein by reference.

FIELD

Embodiments described herein relate generally to a semiconductor device.

BACKGROUND

A semiconductor device such as a MOSFET (Metal Oxide Semiconductor Field Effect Transistor), an IGBT (Insulated Gate Bipolar Transistor), or the like is used as a switching device. It is desirable for the on-resistance of the semiconductor device to be low to reduce the power consumption of the semiconductor device.

BRIEF DESCRIPTION OF THE DRAWINGS

FIG. 3A to FIG. 5D are process cross-sectional views illustrating manufacturing processes of the semiconductor device according to the embodiment;

FIG. 7A to FIG. 8B are cross-sectional views illustrating portions of semiconductor devices according to modifications of the embodiment.

DETAILED DESCRIPTION

According to one embodiment, a semiconductor device includes a first semiconductor region of a first conductivity type, a second semiconductor region of a second conductivity type, a third semiconductor region of the first conductivity type, a gate electrode, and a conductive portion. The second semiconductor region is provided on the first semiconductor region. The third semiconductor region is provided on the second semiconductor region. The gate electrode opposes, in a second direction with a gate insulating layer interposed, the third semiconductor region, the second semiconductor region, and a portion of the first semiconductor region. The second direction is perpendicular to a first direction. The first direction is from the second semiconductor region toward the third semiconductor region. The conductive portion is electrically connected to the second semiconductor region and the third semiconductor region. The conductive portion includes a first portion and a second portion. The first portion is arranged in the second direction with a portion of the second semiconductor region. The second portion is arranged in the second direction with at least a portion of the third semiconductor region. A length in the second direction of the first portion is longer than a length in the second direction of the second portion.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following description, the notations of $n^+$, n, $p^+$, and p indicate relative levels of the impurity concentrations of the conductivity types. In other words, a notation marked with "+" indicates an impurity concentration relatively higher than a notation not marked with either "+" or "−;" and a notation marked with "−" indicates an impurity concentration relatively lower than a notation not marked with either "+" or "−."

The embodiments described below may be implemented by reversing the p-type and the n-type of the semiconductor regions.

Figure 1:
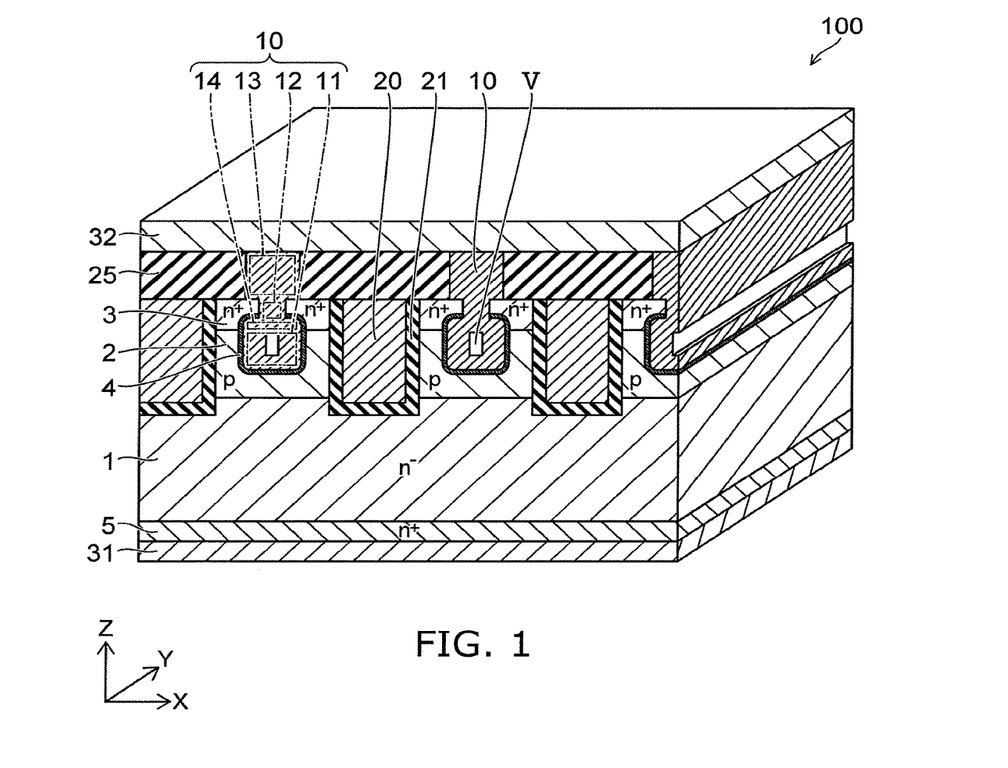
FIG. 1 is a perspective cross-sectional view illustrating a portion of a semiconductor device according to an embodiment.

FIG. 1 is a perspective cross-sectional view illustrating a portion of a semiconductor device according to an embodiment.

As illustrated in FIG. 1, the semiconductor device 100 according to the embodiment includes an $n^-$-type (first conductivity-type) drift region 1 (a first semiconductor region), a p-type (second conductivity-type) base region 2 (a second semiconductor region), an $n^+$-type source region 3 (a third semiconductor region), a $p^+$-type contact region 4 (a fourth semiconductor region), an $n^+$-type drain region 5 (a sixth semiconductor region), a conductive portion 10, a gate electrode 20, a gate insulating layer 21, an insulating layer 25, a drain electrode 31 (a first electrode), and a source electrode 32 (a second electrode).

An XYZ orthogonal coordinate system is used in the description of the embodiments. The direction from the p-type base region 2 toward the $n^+$-type source region 3 is taken as a Z-direction (a first direction). Two mutually-orthogonal directions perpendicular to the Z-direction are taken as an X-direction (a second direction) and a Y-direction (a third direction). For the description, the direction from the p-type base region 2 toward the $n^+$-type source region 3 is called "up;" and the reverse direction is called "down." These directions are based on the relative positional relationship between the p-type base region 2 and the $n^+$-type source region 3 and are independent of the direction of gravity.

The $n^+$-type drain region 5 is provided on the drain electrode 31 and is electrically connected to the drain electrode 31. The $n^-$-type drift region 1 is provided on the $n^+$-type drain region 5. The p-type base region 2 is provided on a portion of the $n^-$-type drift region 1. The $n^+$-type source region 3 is provided on the p-type base region 2. In the example illustrated in FIG. 1, multiple $n^+$-type source regions 3 are provided on the p-type base region 2.

The gate electrode 20 opposes, in the X-direction with the gate insulating layer 21 interposed, the p-type base region 2, a portion of the $n^-$-type drift region 1, and at least a portion of the n+-type source region 3. The insulating layer 25 is provided on the gate electrode 20 and on a portion of the n+-type source region 3.

A portion of the conductive portion 10 is surrounded with the p-type base region 2, the n+-type source region 3, and the p+-type contact region 4 and is electrically connected to these semiconductor regions. Another portion of the conductive portion 10 is provided higher than the n+-type source region 3 and is arranged with the insulating layer 25 in the X-direction. The p+-type contact region 4 is provided between the p-type base region 2 and the conductive portion 10 and between the n+-type source region 3 and the conductive portion 10. The source electrode 32 is provided on the conductive portion 10 and the insulating layer 25 and is electrically connected to the conductive portion 10.

For example, the p-type base region 2, the n+-type source region 3, the conductive portion 10, and the gate electrode 20 each are multiply provided in the X-direction and extend in the Y-direction.

The conductive portion 10 includes a first portion 11, a second portion 12, a third portion 13, and a fourth portion 14. The first portion 11 is arranged with a portion of the p-type base region 2 in the X-direction. The second portion 12 is arranged with the n+-type source region 3 in the X-direction. The third portion 13 is positioned higher than the n+-type source region 3 and is arranged with the insulating layer 25 in the X-direction. The fourth portion 14 is positioned between the first portion 11 and the second portion 12 and is arranged with the n+-type source region 3 in the X-direction. A void V may be provided in the conductive portion 10. At least a portion of the void V is provided inside the first portion 11.

Figure 2:
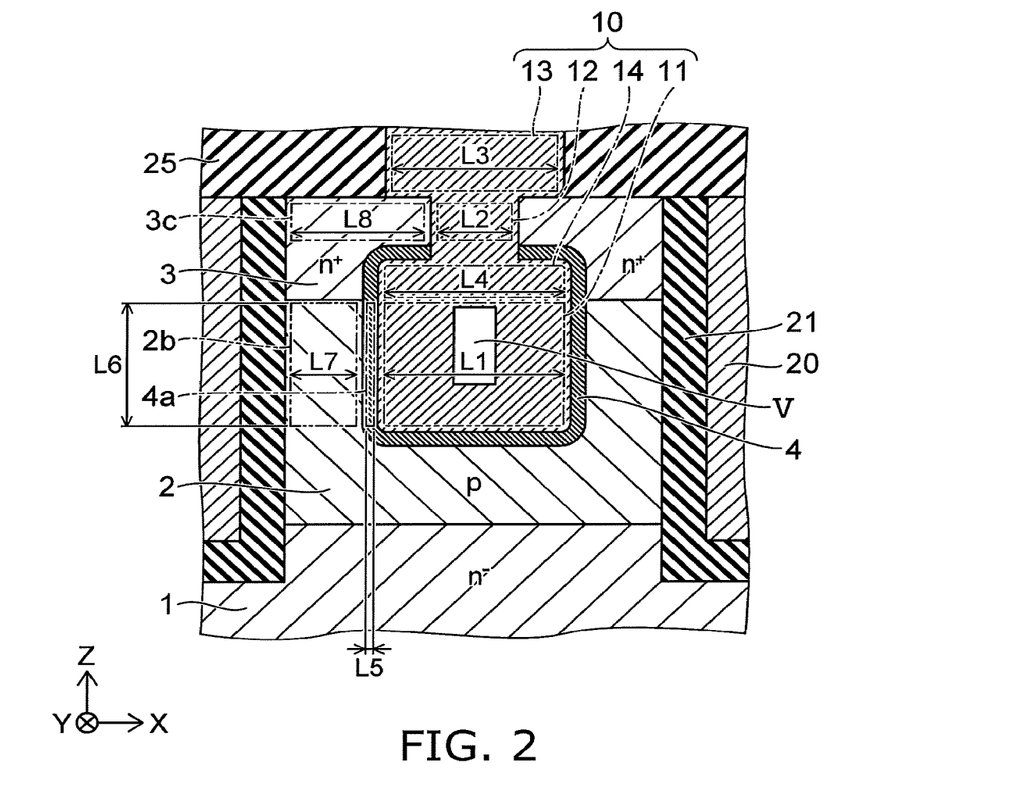
FIG. 2 is a cross-sectional view in which a portion of FIG. 1 is enlarged.

FIG. 2 is a cross-sectional view in which a portion of FIG. 1 is enlarged.

As illustrated in FIG. 2, a length L1 in the X-direction of the first portion 11 is longer than a length L2 in the X-direction of the second portion 12. A length L3 in the X-direction of the third portion 13 is longer than the length L2. The length L3 may be longer or shorter than the length L1. A length L4 in the X-direction of the fourth portion 14 is longer than the length L2.

It is desirable for the length L1 to be more than 1.0 times and not more than 2.5 times the length L2. In the case where the length in the X-direction of the first portion 11 and the length in the X-direction of the second portion 12 change in the Z-direction, it is desirable for the longest length in the X-direction of the first portion 11 to be more than 1.0 times and not more than 3.0 times the shortest length in the X-direction of the second portion 12.

The p+-type contact region 4 includes a first region 4a. The first region 4a is positioned between the first portion 11 and the gate electrode 20 in the X-direction. The p+-type contact region 4 is provided along the conductive portion 10. Therefore, for example, a length L5 in the X-direction of the first region 4a is shorter than a length L6 in the Z-direction of the first region 4a.

The p-type base region 2 includes a second region 2b arranged with the first portion 11 in the X-direction. The second region 2b is positioned between the first portion 11 and the gate electrode 20 in the X-direction. The n+-type source region 3 includes a third region 3c arranged with the second portion 12 in the X-direction. For example, at least a portion of the third region 3c is positioned between the second portion 12 and the gate electrode 20 in the X-direction. A length L8 in the X-direction of the third region 3c is longer than a length L7 in the X-direction of the second region 2b. The length L5 is shorter than the length L7.

The p-type impurity concentration in the p-type base region 2 is, for example, not less than $1\times10^{17}$ atoms/cm$^3$ and not more than $1\times10^{18}$ atoms/cm$^3$. The p-type impurity concentration in the p+-type contact region 4 is, for example, not less than $1\times10^{19}$ atoms/cm$^3$ and not more than $5\times10^{21}$ atoms/cm$^3$. In the case where these semiconductor regions include an n-type impurity and a p-type impurity, for example, the value of the n-type impurity concentration subtracted from the p-type impurity concentration is within the range recited above.

Operations of the semiconductor device 100 will now be described.

When a voltage that is a threshold or more is applied to the gate electrode 20 in a state in which a voltage that is positive with respect to the source electrode 32 is applied to the drain electrode 31, a channel (an inversion layer) is formed at the gate insulating layer 21 vicinity of the p-type base region 2. Thereby, the semiconductor device 100 is set to an on-state. Electrons pass through the channel and flow from the source electrode 32 toward the drain electrode 31. Subsequently, when the voltage that is applied to the gate electrode 20 becomes lower than the threshold, the channel in the p-type base region 2 disappears; and the semiconductor device 100 is set to an off-state.

Examples of the materials of the components will now be described.

The n−-type drift region 1, the p-type base region 2, the n+-type source region 3, the p+-type contact region 4, and the n+-type drain region 5 include silicon, silicon carbide, gallium nitride, or gallium arsenide as a semiconductor material. In the case where silicon is used as the semiconductor material, arsenic, phosphorus, or antimony may be used as an n-type impurity; and boron may be used as a p-type impurity.

The conductive portion 10 includes a metal such as titanium, tungsten, etc.

The gate electrode 20 includes a conductive material such as polysilicon, etc.

The gate insulating layer 21 and the insulating layer 25 include an insulating material such as silicon oxide, etc.

The drain electrode 31 and the source electrode 32 include a metal such as aluminum, etc.

An example of a method for manufacturing the semiconductor device according to the embodiment will now be described with reference to FIG. 3A to FIG. 5D.

FIG. 3A to FIG. 5D are process cross-sectional views illustrating manufacturing processes of the semiconductor device according to the embodiment.

Figure 3A:
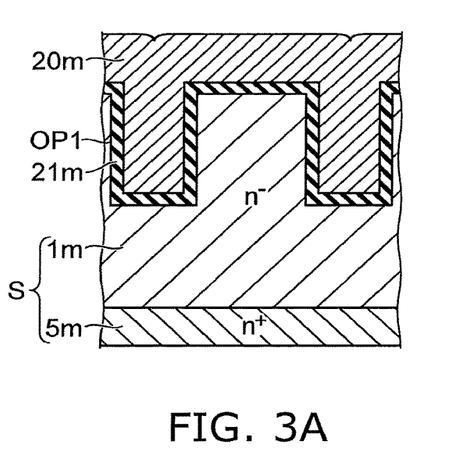

First, a semiconductor substrate S that is made of silicon and includes an n+-type semiconductor region 5m and an n-type semiconductor region 1m is prepared. The n-type semiconductor region inn is provided on the n+-type semiconductor region 5m. Multiple openings OP1 are formed in the upper surface of the n-type semiconductor region 1m by using photolithography and RIE (Reactive Ion Etching). An insulating layer 21m is formed along the inner walls of the openings OP1 and the upper surface of the n-type semiconductor region 1m by performing thermal oxidation of the semiconductor substrate S. A conductive layer 20m is formed on the insulating layer 21m as illustrated in FIG. 3A by using CVD (Chemical Vapor Deposition). The multiple openings OP1 are filled with the conductive layer 20m.

Figure 3B:
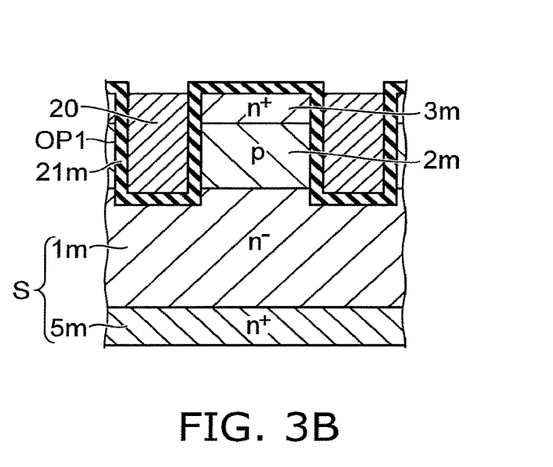

The upper surface of the conductive layer 20m is caused to recede by using CMP (Chemical Mechanical Polishing). Thereby, the conductive layers 20m that are provided inside the openings OP1 are separated from each other; and the multiple gate electrodes 20 are formed. A p-type semiconductor region 2m is formed by ion implantation of a p-type impurity (e.g., boron) into the n-type semiconductor region 1m between the gate electrodes 20. An n⁺-type semiconductor region 3m is formed as illustrated in FIG. 3B by ion implantation of an n-type impurity (e.g., phosphorus) into the surface of the p-type semiconductor region 2m.

Figure 3C:
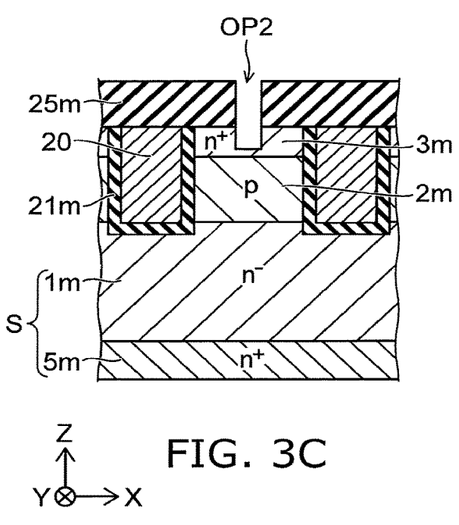

The upper surface of the n⁺-type semiconductor region 3m is exposed by removing a portion of the insulating layer 21m. The remaining insulating layer 21m corresponds to the gate insulating layer 21. An insulating layer 25m that covers the gate electrodes 20 and the n⁺-type semiconductor region 3m is formed. As illustrated in FIG. 3C, an opening OP2 that pierces the insulating layer 25m in the Z-direction and reaches the n⁺-type semiconductor region 3m is formed.

Figure 3D:
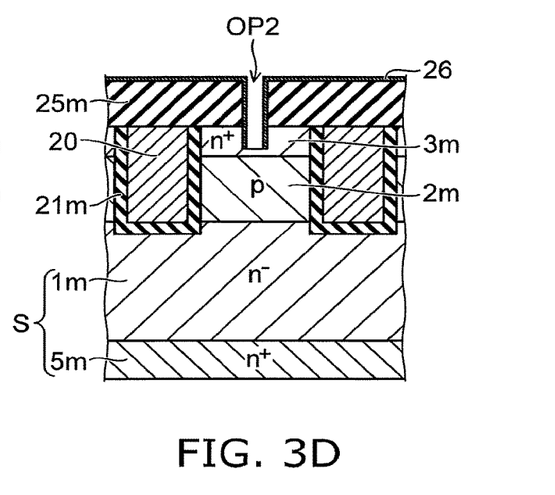

A protective layer 26 is formed along the inner wall of the opening OP2 and the upper surface of the insulating layer 25m. The protective layer 26 is formed not to fill the opening OP2. The protective layer 26 includes, for example, silicon nitride, etc. As illustrated in FIG. 3D, the n⁺-type semiconductor region 3m is exposed by removing the protective layer 26 at the opening OP2 bottom surface.

Figure 4A:
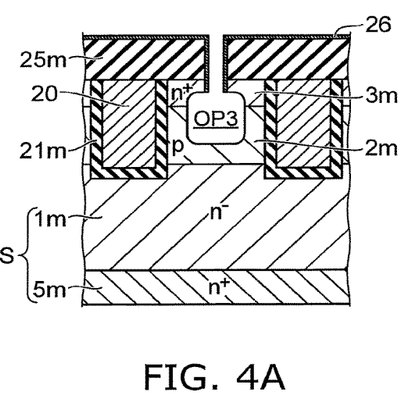

A portion of the p-type semiconductor region 2m and a portion of the n⁺-type semiconductor region 3m are removed by alternately performing anisotropic etching and isotropic etching using the protective layer 26 as a mask. Thereby, as illustrated in FIG. 4A, an opening OP3 that communicates with the opening OP2 is formed. The width (the dimension in the X-direction) of the opening OP3 is wider than the width of the opening OP2. RIE that uses a gas including a halogen element (e.g., bromine) is used as the anisotropic etching. CDE (Chemical Dry Etching) that uses a gas including a halogen element or wet etching that uses potassium hydroxide or the like is used as the isotropic etching.

Figure 4B:
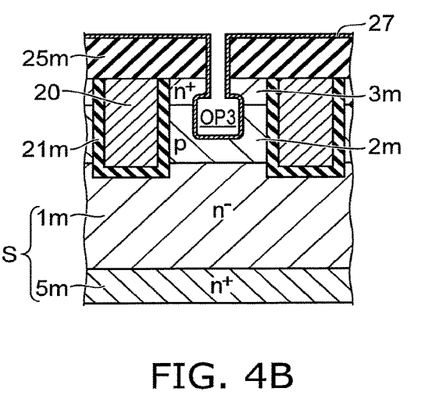

The protective layer 26 is removed. As illustrated in FIG. 4B, an impurity layer 27 that includes a p-type impurity is formed along the inner wall of the opening OP3. The impurity layer 27 also may be formed along the inner wall of the opening OP2 and the upper surface of the insulating layer 25. For example, the impurity layer 27 is formed not to fill the opening OP2 and the opening OP3. The impurity layer 27 includes, for example, BSG (Boron-Silicate Glass).

Figure 4C:
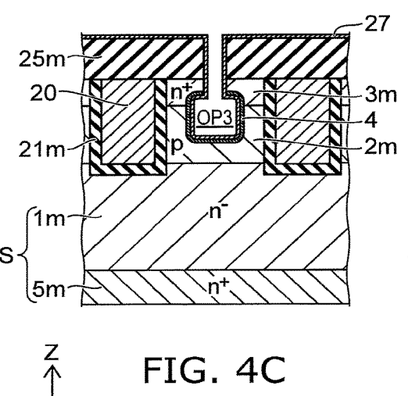

The p-type impurity (the boron) that is included in the impurity layer 27 is diffused into the p-type semiconductor region 2m and the n⁺-type semiconductor region 3m by performing heat treatment. Thereby, as illustrated in FIG. 4C, the p⁺-type contact region 4 is formed in the portion of the p-type semiconductor region 2m contacting the impurity layer 27. The p⁺-type contact region 4 also may be formed in at least a portion of the n⁺-type semiconductor region 3m contacting the impurity layer 27. At this time, the n-type impurity concentration of the lower portion of the n⁺-type semiconductor region 3m is lower than the n-type impurity concentration of the upper portion of the n⁺-type semiconductor region 3m. Therefore, for example, the conductivity type of the lower portion of the portion of the n⁺-type semiconductor region 3m contacting the impurity layer 27 is converted from the n-type to the p-type. The n⁺-type semiconductor region 3m and the p-type semiconductor region 2m other than the p⁺-type contact region 4 correspond respectively to the n⁺-type source region 3 and the p-type base region 2.

Figure 4D:
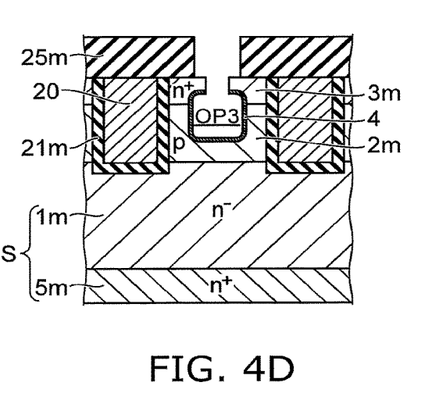
Figure 5A:
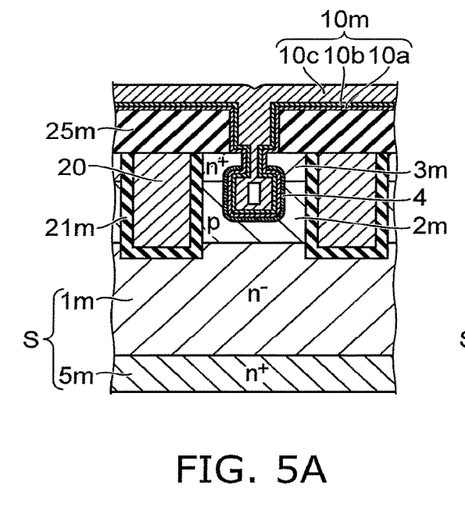
Figure 5B:
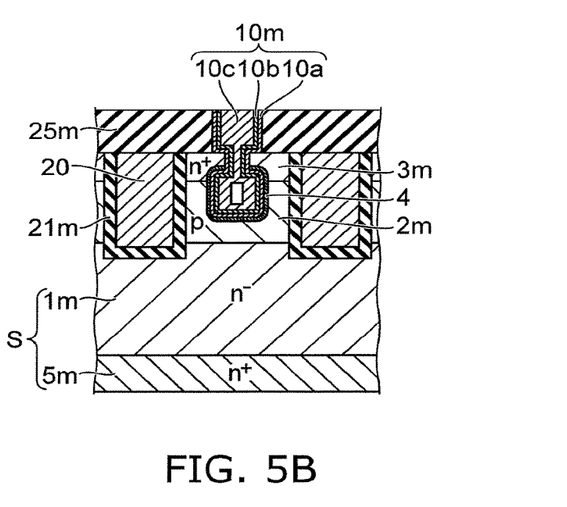

The impurity layer 27 is removed. As illustrated in FIG. 4D, the width of the opening OP2 is widened by removing a portion of the insulating layer 25m by using photolithography and RIE. As illustrated in FIG. 5A, a titanium layer 10a, a titanium nitride layer 10b, and a tungsten layer 10c are stacked in order along the inner wall of the opening OP2 and the inner wall of the opening OP3. Thereby, a conductive layer 10m that includes these layers is formed. As illustrated in FIG. 5B, the portion of the conductive layer 10m that is provided on the insulating layer 25m is removed. The remaining conductive layer 10m corresponds to the conductive portion 10.

Figure 5C:
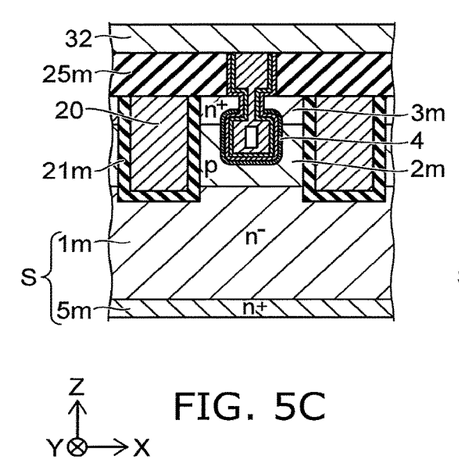
Figure 5D:
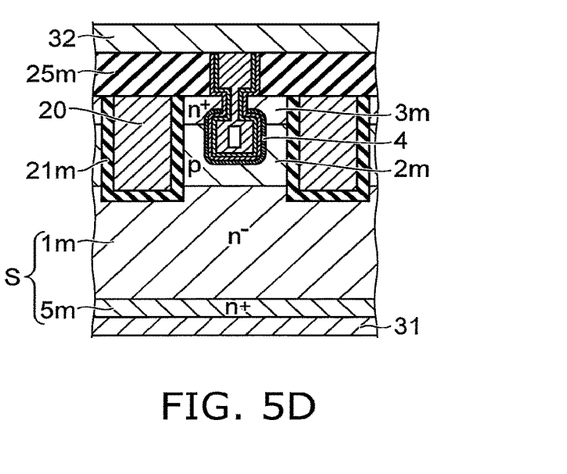

The source electrode 32 that contacts the conductive layer 10m is formed on the insulating layer 25m. As illustrated in FIG. 5C, the back surface of the semiconductor substrate S is polished until the thickness (the length in the Z-direction) of the n⁺-type semiconductor region 5m becomes a prescribed value. The remaining n⁺-type semiconductor region 5m corresponds to the n⁺-type drain region 5. As illustrated in FIG. 5D, the drain electrode 31 is formed at the back surface of the semiconductor substrate S after the polishing. By the processes recited above, the semiconductor device 100 according to the embodiment illustrated in FIG. 1 and FIG. 2 is manufactured.

Effects of the embodiment will now be described with reference to FIG. 6.

Figure 6:
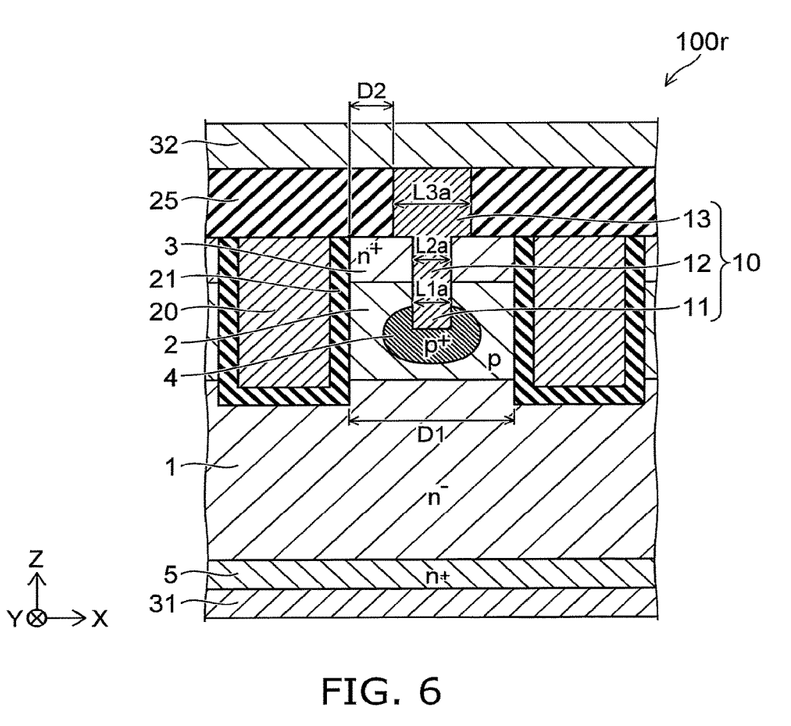
FIG. 6 is a cross-sectional view illustrating a portion of a semiconductor device according to a reference example.

FIG. 6 is a cross-sectional view illustrating a portion of a semiconductor device according to a reference example.

In the semiconductor device 100r illustrated in FIG. 6, a length L1a in the X-direction of the first portion 11 and a length L2a in the X-direction of the second portion 12 are the same. The p⁺-type contact region 4 is provided around the lower portion of the first portion 11.

To increase the on-current of the semiconductor device, it is desirable for a distance D1 in the X-direction between the gate electrodes 20 (the width of the p-type base region 2) to be short. By setting the distance D1 to be short, more gate electrodes 20 can be formed. As a result, more channels are formed in the on-state of the semiconductor device; and the on-resistance can be reduced.

To reduce the electrical resistance between the n⁺-type source region 3 and the conductive portion 10, it is desirable for the contact surface area between the n⁺-type source region 3 and the conductive portion 10 to be large. To increase the contact surface area, it is desirable for a length L1a in the X-direction of the third portion 13 to be the length L2a or more.

On the other hand, in the case where a distance D2 in the X-direction between the third portion 13 and the gate electrodes 20 is short, there is a possibility that the n⁺-type source region 3 and the gate electrodes 20 may be electrically connected in the manufacturing process of the semiconductor device. Accordingly, in the semiconductor device 100r illustrated in FIG. 6, it is necessary to set the length L1a and the length L2a to be short to shorten the distance D1 while maintaining the distance D2.

However, in the case where the length L2a is set to be short, the contact surface area between the p-type base region 2 (the p⁺-type contact region 4) and the conductive portion 10 decreases; and the holes are not discharged easily from the p-type base region 2 to the conductive portion 10. If it is difficult for the holes to be discharged, the potential of the p-type base region 2 increases easily when the semiconductor device is in the avalanche state. As a result, a parasitic NPN transistor that includes the n⁻-type drift region 1, the p-type base region 2, and the n⁺-type source region 3 operates easily; and the likelihood of the occurrence of breakdown of the semiconductor device increases.

In the semiconductor device 100 according to the embodiment, the length L1 in the X-direction of the first portion 11 is longer than the length L2 in the X-direction of the second portion 12. Therefore, even in the case where the length L2 is set to be short to shorten the distance D1, the holes are discharged efficiently from the p-type base region 2 to the conductive portion 10. Accordingly, according to the embodiment, the on-resistance of the semiconductor device can be reduced while suppressing the operation of the parasitic transistor of the semiconductor device.

In the case where the distance D1 is set to be short and the distance between the p+-type contact region 4 and the gate insulating layer 21 becomes short, there is a possibility that the threshold of the gate voltage for turning on the semiconductor device may fluctuate. When the threshold of the gate voltage fluctuates, the operation of the semiconductor device becomes unstable.

In the semiconductor device 100, the p+-type contact region 4 is provided along the first portion 11 as illustrated in FIG. 2. For example, the length L5 in the X-direction of the first region 4a of the p+-type contact region 4 is shorter than the length L6 in the Z-direction of the first region 4a. According to this configuration, the distance D1 can be short while suppressing the reduction of the distance in the X-direction between the p+-type contact region 4 and the gate insulating layer 21. In other words, the on-resistance of the semiconductor device can be reduced while suppressing the decrease of the stability of the operation.

It is desirable for the p+-type contact region 4 to be provided not only between the p-type base region 2 and the conductive portion 10 but also between the n+-type source region 3 and the conductive portion 10. The contact surface area between the p+-type contact region 4 and the conductive portion 10 can be increased further by providing a portion of the p+-type contact region 4 between the n+-type source region 3 and the conductive portion 10. Thereby, the holes are discharged more easily to the source electrode 32 in the avalanche state; and it becomes more difficult for the parasitic transistor to operate.

As illustrated in FIG. 1 and FIG. 2, it is desirable for the void V to be provided in the first portion 11. The volume of the first portion 11 is reduced by providing the void V. The change of the volume of the first portion 11 due to a temperature change is reduced by reducing the volume of the first portion 11. As a result, the stress that is due to the volume change of the first portion 11 and is applied to the p-n junction surface between the n−-type drift region 1 and the p-type base region 2 positioned below the first portion 11 can be reduced. By reducing the stress applied to the p-n junction surface, the occurrence of crystal defects at the p-n junction surface can be suppressed; and the occurrence of a leakage current can be suppressed.

It is desirable for the length L3 illustrated in FIG. 2 to be the length L2 or more to increase the contact surface area between the n+-type source region 3 and the conductive portion 10. More desirably, the length L3 is longer than the length L2.

FIG. 7A to FIG. 8B are cross-sectional views illustrating portions of semiconductor devices according to modifications of the embodiment.

Figure 7A:
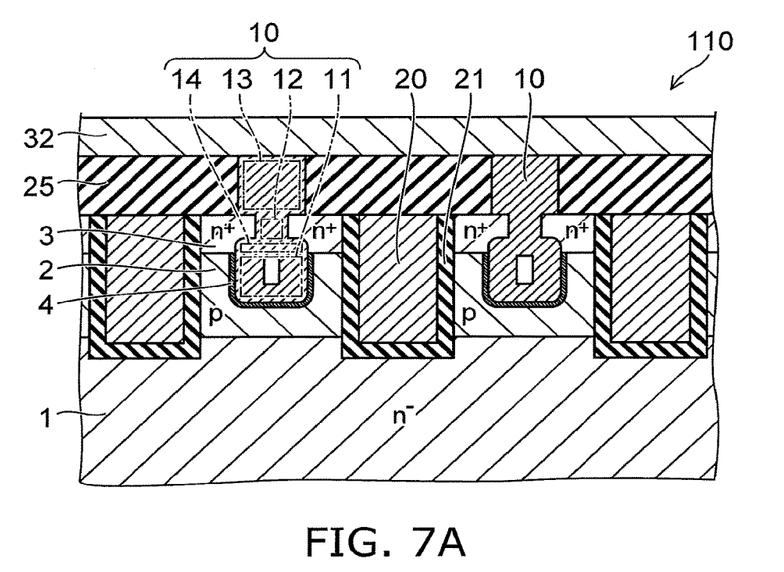

In a semiconductor device 110 illustrated in FIG. 7A, the p+-type contact region 4 is provided only between the p-type base region 2 and the conductive portion 10. The p+-type contact region 4 is not provided between the n+-type source region 3 and the conductive portion 10.

Figure 7B:
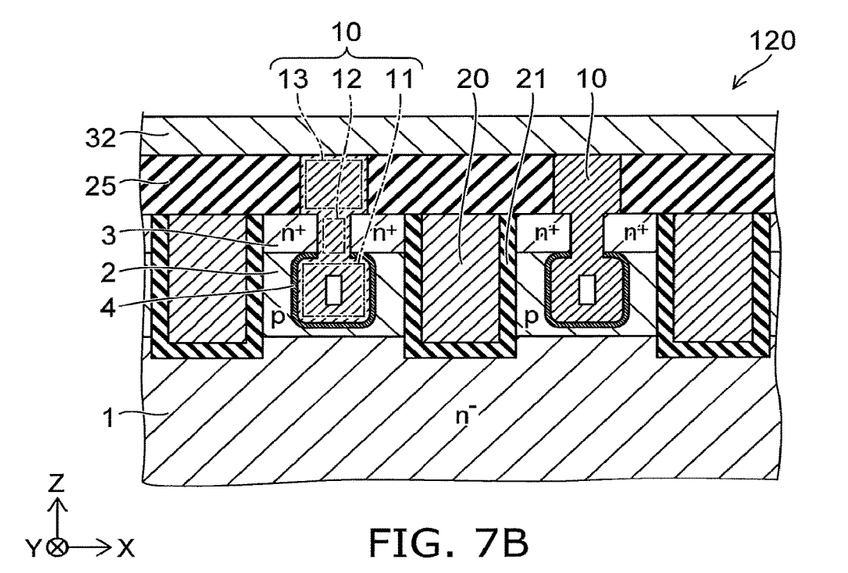

In a semiconductor device 120 illustrated in FIG. 7B, the conductive portion 10 does not include the fourth portion 14. In other words, the second portion 12 of which the length in the X-direction is shorter than that of the first portion 11 is arranged with the entire n+-type source region 3 in the X-direction.

Figure 8A:
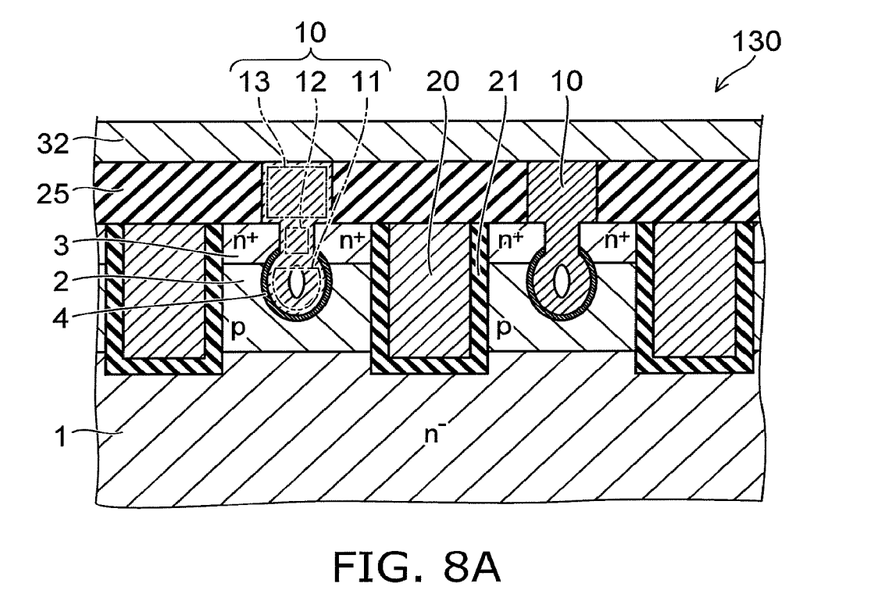

In a semiconductor device 130 illustrated in FIG. 8A, the configuration of the first portion 11 is different from that of the semiconductor device 100. In the semiconductor device 100, the length in the X-direction of the first portion 11 is substantially uniform in the Z-direction. In the semiconductor device 130, the length in the X-direction of the first portion 11 increases downward and then decreases downward.

Figure 8B:
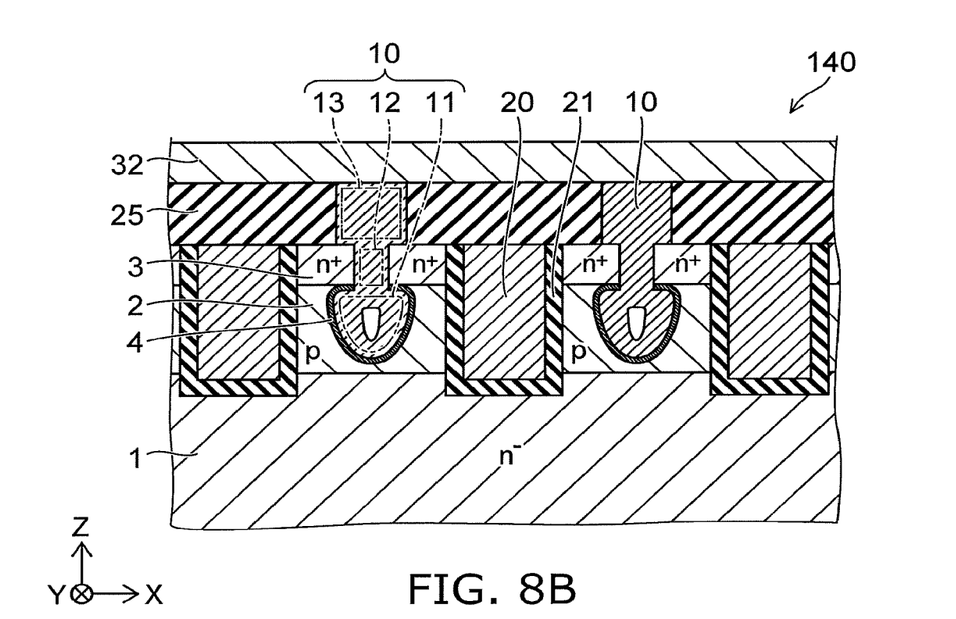

In a semiconductor device 140 illustrated in FIG. 8B, the length in the X-direction of the upper portion of the first portion 11 is different from the length in the X-direction of the lower portion of the first portion 11. Specifically, the length in the X-direction of the upper portion of the first portion 11 is longer than the length in the X-direction of the lower portion of the first portion 11. Or, the length in the X-direction of the lower portion of the first portion 11 may be longer than the length in the X-direction of the upper portion of the first portion 11.

Thus, the specific configuration of the conductive portion 10 is modifiable as appropriate as long as the length in the X-direction of at least a portion of the first portion 11 is longer than the length in the X-direction of at least a portion of the second portion 12.

Figure 9:
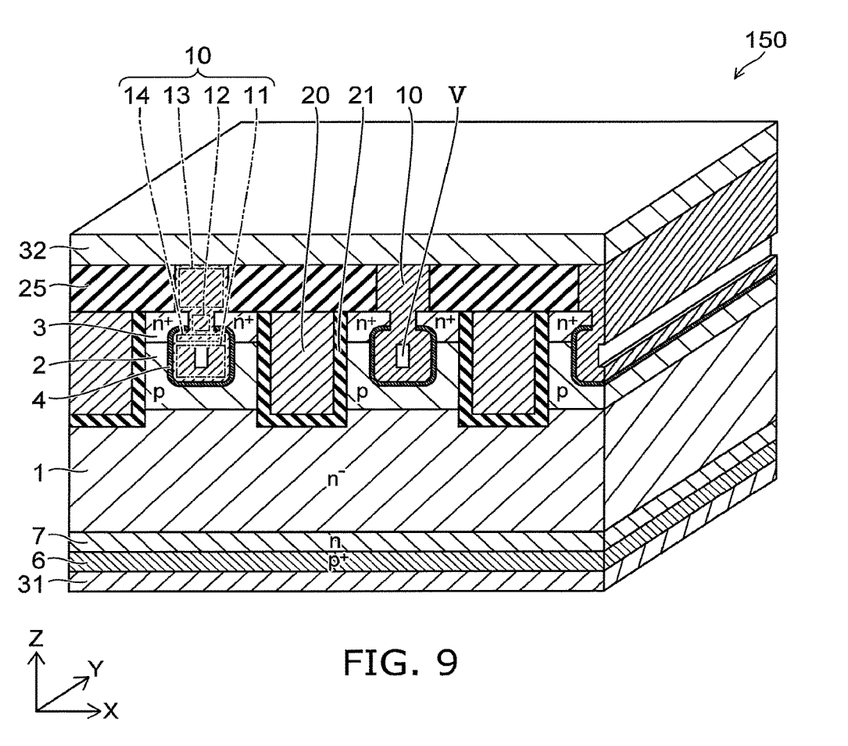
FIG. 9 is a perspective cross-sectional view illustrating a portion of a semiconductor device according to a modification of the embodiment.

FIG. 9 is a perspective cross-sectional view illustrating a portion of a semiconductor device according to a modification of the embodiment.

The semiconductor device 150 illustrated in FIG. 9 is an IGBT (Insulated Gate Bipolar Transistor). The semiconductor device 150 includes a p+-type collector region 6 (a fifth semiconductor region) and an n-type buffer region 7 instead of the n+-type drain region 5. In the semiconductor device 150, the electrode 31 functions as a collector electrode; and the electrode 32 functions as an emitter electrode. The n+-type source region 3 functions as an emitter region. The p+-type collector region 6 is electrically connected to the collector electrode 31. The n-type buffer region 7 is provided between the p+-type collector region 6 and the n−-type drift region 1.

In the semiconductor device 150 which is an IGBT as well, by setting the length in the X-direction of the first portion 11 to be longer than the length in the X-direction of the second portion 12, the on-resistance of the semiconductor device can be reduced while suppressing the operation of the parasitic transistor of the semiconductor device.

The specific configuration of the conductive portion 10 of the semiconductor device 150 is modifiable as appropriate similarly to the examples illustrated in FIG. 7A to FIG. 8B.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM.

It is possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:
1. A semiconductor device, comprising:
a first semiconductor region of a first conductivity type;
a second semiconductor region provided on the first semiconductor region, the second semiconductor region being of a second conductivity type;

a third semiconductor region provided on the second semiconductor region, the third semiconductor region being of the first conductivity type;

a gate electrode, the gate electrode opposing, in a second direction with a gate insulating layer interposed, the third semiconductor region, the second semiconductor region, and a portion of the first semiconductor region, the second direction being perpendicular to a first direction, the first direction being from the second semiconductor region toward the third semiconductor region; and a conductive portion electrically connected to the second semiconductor region and the third semiconductor region, the conductive portion including a first portion and a second portion, the first portion being arranged in the second direction with a portion of the second semiconductor region, the second portion being arranged in the second direction with at least a portion of the third semiconductor region, a length in the second direction of the first portion being longer than a length in the second direction of the second portion.

2. The device according to claim 1, wherein the conductive portion further includes a third portion positioned higher than the third semiconductor region, and a length in the second direction of the third portion is not less than the length of the second portion.

3. The device according to claim 1, further comprising a fourth semiconductor region provided between the second semiconductor region and the conductive portion, the fourth semiconductor region being of the second conductivity type, an impurity concentration of the second conductivity type in the fourth semiconductor region being higher than an impurity concentration of the second conductivity type in the second semiconductor region.

4. The device according to claim 3, wherein the fourth semiconductor region is further provided between the third semiconductor region and the conductive portion.

5. The device according to claim 3, wherein the fourth semiconductor region includes a first region positioned between the second semiconductor region and the first portion in the second direction, and a length in the second direction of the first region is shorter than a length in the first direction of the first region.

6. The device according to claim 1, wherein a void is provided inside the conductive portion, and at least a portion of the void is provided inside the first portion.

7. The device according to claim 1, wherein the second semiconductor region includes a second region arranged with the first portion in the second direction, the third semiconductor region includes a third region arranged with the second portion in the second direction, and a length in the second direction of the third region is longer than a length in the second direction of the second region.

8. The device according to claim 1, wherein the conductive portion further includes a fourth portion positioned between the first portion and the second portion in the first direction, the fourth portion is arranged with a portion of the third semiconductor region in the second direction, and a length in the second direction of the fourth portion is longer than the length of the second portion.

9. The device according to claim 1, wherein a length in the second direction of at least a portion of the first portion is more than 1.0 times and not more than 2.5 times a length in the second direction of at least a portion of the second portion.

10. The device according to claim 1, further comprising:

a first electrode electrically connected to the first semiconductor region; and a second electrode electrically connected to the conductive portion.

11. The device according to claim 10, further comprising a fifth semiconductor region provided between the first electrode and the first semiconductor region, the fifth semiconductor region being of the second conductivity type, the fifth semiconductor region being electrically connected to the first electrode, an impurity concentration of the second conductivity type in the fifth semiconductor region being higher than an impurity concentration of the second conductivity type in the second semiconductor region.

* * * * *